United States Patent
Tohoda et al.

(10) Patent No.: US 9,966,287 B2
(45) Date of Patent: May 8, 2018

(54) DRYING HOLDER FOR SOLAR CELL AND METHOD FOR PRODUCING SOLAR CELL

(71) Applicant: SANYO Electric Co., Ltd., Osaka (JP)

(72) Inventors: Satoshi Tohoda, Osaka (JP); Shigeharu Taira, Hyogo (JP); Takeshi Nishiwaki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 295 days.

(21) Appl. No.: 14/193,665

(22) Filed: Feb. 28, 2014

(65) Prior Publication Data

US 2014/0173930 A1    Jun. 26, 2014

Related U.S. Application Data

(63) Continuation of application No. PCT/JP2011/069776, filed on Aug. 31, 2011.

(51) Int. Cl.
| | | |
|---|---|---|
| H01L 21/673 | (2006.01) | |
| H01L 21/67 | (2006.01) | |
| F26B 5/00 | (2006.01) | |
| H01L 21/677 | (2006.01) | |

(52) U.S. Cl.
CPC .......... *H01L 21/67326* (2013.01); *F26B 5/00* (2013.01); *H01L 21/67034* (2013.01); *H01L 21/67109* (2013.01); *H01L 21/67712* (2013.01)

(58) Field of Classification Search
CPC ......... H01L 21/67326; H01L 21/67109; H01L 21/67712; H01L 21/67034; F26B 5/00; F26B 21/00; F26B 21/004; F26B 25/185
See application file for complete search history.

(56) References Cited

U.S. PATENT DOCUMENTS 5,423,131 A    6/1995    Shibano

FOREIGN PATENT DOCUMENTS

| JP | 06055123 A | 3/1994 |
|---|---|---|
| JP | 06091238 A | 4/1994 |
| JP | H06221757 A | 8/1994 |
| JP | 08046107 A | 2/1996 |
| JP | 2000180052 A | 6/2000 |
| JP | 2001057356 A | 2/2001 |
| JP | 2002203888 A * | 7/2002 |
| JP | 2002246437 A | 8/2002 |
| JP | 2008300796 A | 12/2008 |

* cited by examiner

*Primary Examiner* — Jessica Yuen
(74) *Attorney, Agent, or Firm* — Cantor Colburn LLP (57) ABSTRACT

A drying holder holds a solar cell in an upright state, and is used in an electrode drying process. The drying holder is provided with a base part on which the solar cell is placed, and a support part that is disposed on the base part, and forms a support slot that is capable of accommodating the solar cell. Vents are formed on the base part and/or the support part.

5 Claims, 6 Drawing Sheets

DRYING HOLDER FOR SOLAR CELL AND METHOD FOR PRODUCING SOLAR CELL

CROSS-REFERENCE TO RELATED APPLICATIONS

The present application is a continuation under 35 U.S.C. § 120 of PCT/JP2011/069776, filed Aug. 31, 2011, which is incorporated herein by reference.

TECHNICAL FIELD

The present invention relates to a drying holder for a solar cell and a method for producing the solar cell.

BACKGROUND ART

An electrode of a solar cell is formed by printing conductive paste on a surface of a semiconductor substrate, for instance. Since the conductive paste contains a solvent, a drying process for removing the solvent is provided in a production process of the electrode. The drying process is carried out by continuously supplying the plurality of solar cells into a drying facility, and at that time, a drying holder for stably holding the solar cell in an upright state is used (see Patent Literature 1, for instance).

CITATION LIST

Patent Literature

Patent Literature 1: Japanese Patent Laid-Open Publication No. 2002-246437

SUMMARY OF INVENTION

Technical Problem

However, when a conventional drying holder is used, there is a risk that long-term reliability of a solar cell will decline due to a drying defect.

Figure 11:
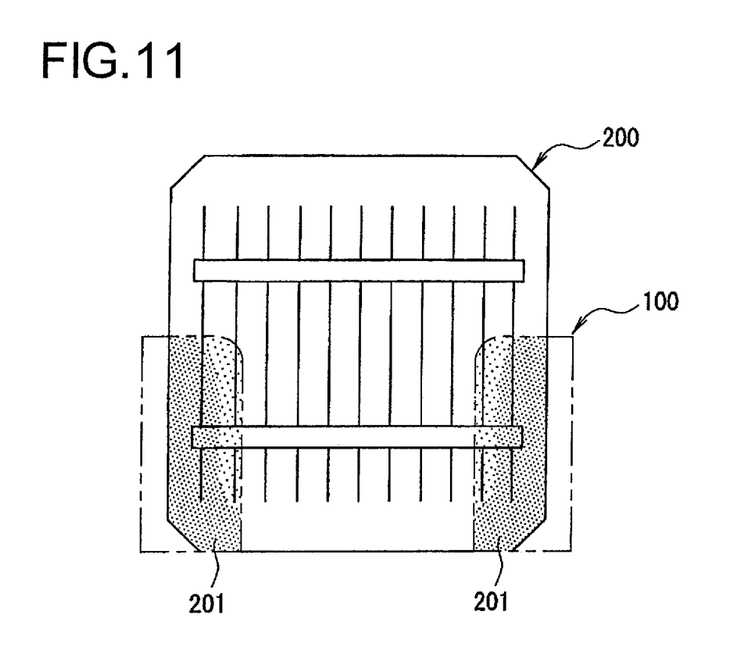
FIG. 11 is a view schematically illustrating the in-plane distribution of series resistance of a solar cell produced using a conventional drying holder.

FIG. 11 schematically illustrates a result of checking the in-plane distribution of series resistance of a solar cell 200 produced using a conventional drying holder 100. It is indicated that the series resistance is higher in an area of a higher dot density. According to the figure, it is recognized that a high resistance area 201 roughly overlaps with an area covered with the drying holder 100, that is indicated by two-dot chain lines.

Solution to Problem

A drying holder for a solar cell according to the present invention holds the solar cell in an upright state, is used in a drying process of the solar cell, and includes a base part on which the solar cell is placed, and a support part that is disposed on the base part and forms a support slot capable of accommodating the solar cell, and vents are formed on at least one of the base part and the support part.

Advantageous Effect of Invention

According to the drying holder for the solar cell according to the present invention, decline in the reliability of the solar cell can be suppressed.

DESCRIPTION OF EMBODIMENTS

Embodiments according to the present invention will be described in detail with reference to drawings.

The present invention is not limited to the following embodiments. Also, the drawings that are referred to in the embodiments are schematically described, and dimension ratios or the like of components drawn in the drawings may be different from the actual thing. A concrete dimension ratio or the like should be determined in consideration of the following descriptions.

Hereinafter, as a matter of convenience of descriptions, terms indicating "up-down", "left-right", and "front-back" directions are used. However, relationships between the directions and respective components are not limited. The "up-down direction" of the drying holder is a direction along a vertical direction in the state of holding a solar cell, and corresponds to the up-down direction of a paper surface of FIG. 5. The "left-right direction" of the drying holder corresponds to the left-right direction of the paper surface of FIG. 5, and the "front-back direction" corresponds to the direction perpendicular to the paper surface of FIG. 5. Also, the "left-right direction" corresponds to a longitudinal direction of a base part.

With reference to FIG. 1 to FIG. 5, a configuration of a drying holder 10 for a solar cell, which is the first embodiment (hereinafter, referred to as the drying holder 10), will be described in detail.

Figure 1:
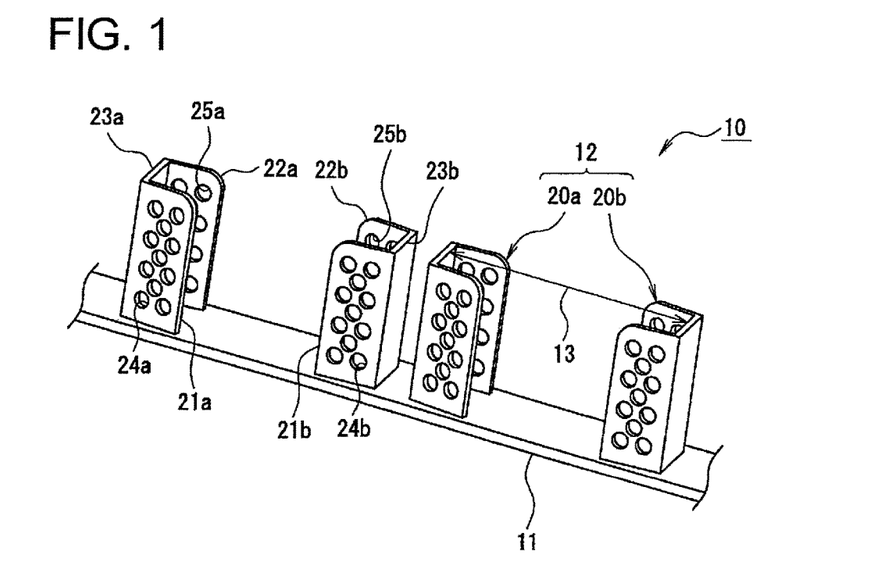
FIG. 1 is a perspective view illustrating a drying holder which is a first embodiment according to the present invention.
Figure 2:
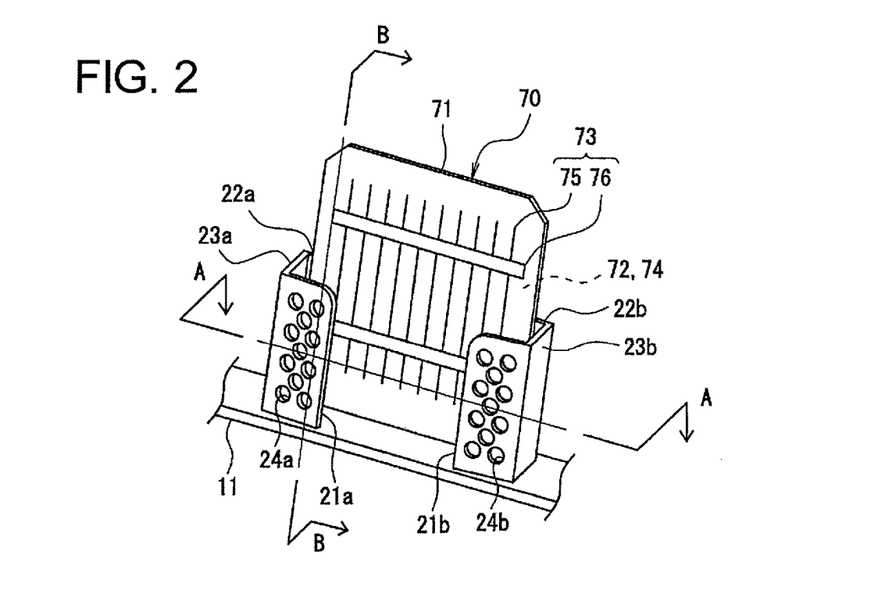
FIG. 2 is a view illustrating the situation of accommodating the solar cell in the drying holder which is the first embodiment according to the present invention.
Figure 3:
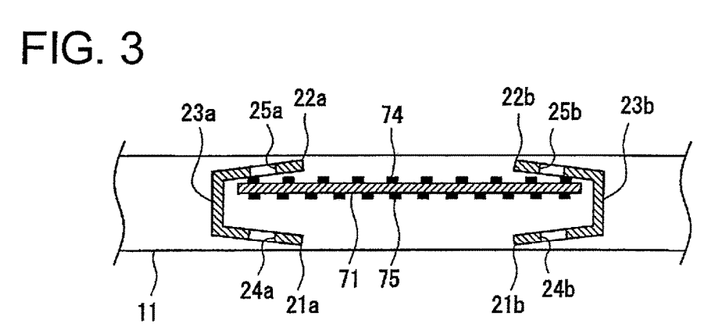
FIG. 3 is a view schematically illustrating an A-A cross section of FIG. 2.
Figure 4:
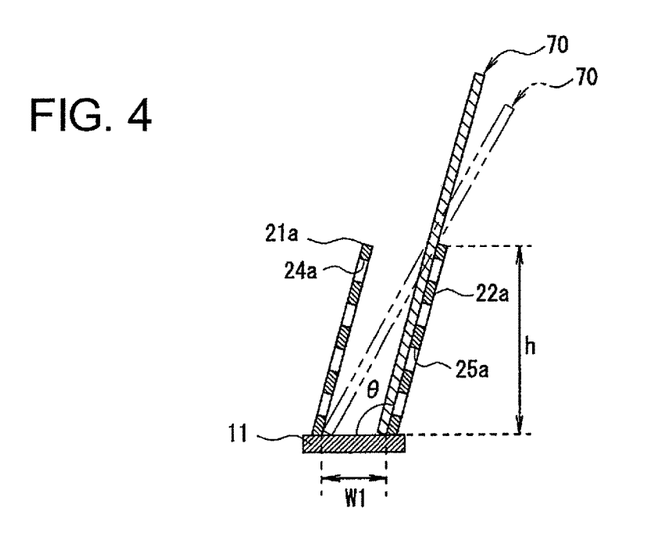
FIG. 4 is a view schematically illustrating a B-B cross section of FIG. 2.

FIG. 1 is a perspective view viewing the drying holder 10 from the front side, and FIG. 2 is a view illustrating the situation of accommodating a solar cell 70 in a support slot 13 of the drying holder 10. FIG. 3 is a view schematically illustrating an A-A cross section of FIG. 2, and FIG. 4 is a view schematically illustrating a B-B cross section of FIG.

Figure 5:
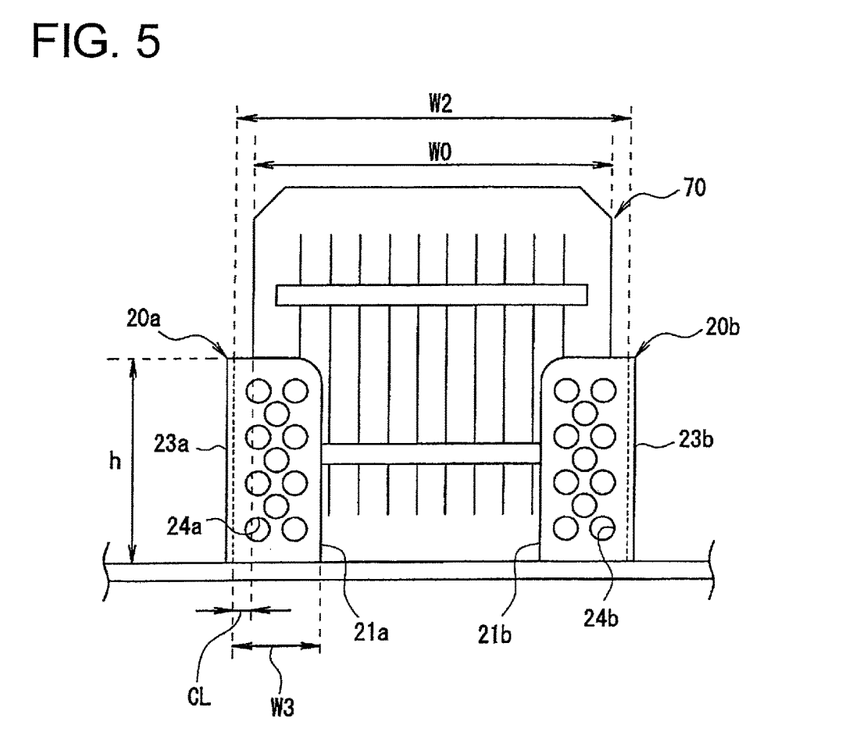
FIG. 5 is a plan view viewing the drying holder illustrated in FIG. 2 from the front.

2, respectively. FIG. 5 is a plan view viewing the drying holder 10 accommodating the solar cell 70 from the front.

In this embodiment, as a solar cell to be held by the drying holder 10, the solar cell 70 including a light receiving surface electrode 72 on a light receiving surface of a photoelectric conversion part 71 and a back surface electrode 73 on a back surface respectively (see FIG. 2 to FIG. 5) is illustrated. The photoelectric conversion part 71 has a function of generating carriers (electrons and holes) by receiving sunlight. In the solar cell 70, the carriers generated in the photoelectric conversion part 71 are collected by the light receiving surface electrode 72 and the back surface electrode 73. The form of the solar cell is not particularly limited, and may be either one of a single crystal type or a polycrystal type.

Here, the "light receiving surface" means a main surface on which the sunlight is mainly made incident from the outside of the solar cell 70. For instance, over 50% to 100% of the sunlight to be made incident on the solar cell 70 is made incident from the light receiving surface side. Also, the "back surface" means a main surface on the opposite side to the light receiving surface. Also, a surface which is along a thickness direction of the solar cell 70 and is perpendicular to the main surface is a side face.

The photoelectric conversion part 71 has such a structure that a p-type is formed on the light receiving surface of a semiconductor substrate, and an n-type amorphous silicon layer is formed on the back surface of the semiconductor substrate, for instance. As a concrete example, the structure is such that an i-type amorphous silicon layer which is an intrinsic amorphous silicon layer and a p-type amorphous silicon layer doped with boron (B) or the like are formed in that order on the light receiving surface of an n-type single crystal silicon substrate, and an i-type amorphous silicon layer and an n-type amorphous silicon layer doped with phosphorus (P) or the like are formed in that order on the back surface of the n-type single crystal silicon substrate. The structure may be such that the i-type amorphous silicon layer and the n-type amorphous silicon layer doped with phosphorus (P) or the like are formed in that order on the light receiving surface of the n-type single crystal silicon substrate, and the i-type amorphous silicon layer and the p-type amorphous silicon layer doped with boron (B) or the like are formed in that order on the back surface of the n-type single crystal silicon substrate.

The light receiving surface electrode 72 preferably includes a transparent conductive layer formed on the light receiving surface of the photoelectric conversion part 71. As the transparent conductive layer, a transparent conductive oxide (TCO) for which a metal oxide such as an indium oxide ($In_2O_3$) or a zinc oxide (ZnO) is doped with tin (Sn) or antimony (Sb) or the like is applicable.

Further, the light receiving surface electrode 72 includes a plurality (for instance, 50) of finger parts 74 and a plurality (for instance, 2) of bus bar parts, not shown. The finger parts 74 and the bus bar parts are preferably formed on the transparent conductive layer. The finger parts 74 are electrodes in a fine wire shape formed over a wide range on the transparent conductive layer. The bus bar parts are electrodes that are thicker and fewer than the finger parts 74, and collect the carriers from the finger parts 74 mainly. The finger parts 74 and the bus bar parts are disposed crossing each other and are electrically connected.

The back surface electrode 73 preferably includes a plurality of finger parts 75, a plurality of bus bar parts 76, and a transparent conductive layer, similarly to the light receiving surface electrode 72. The finger parts 75 are preferably set so as to be more numerous and at narrower intervals compared to the finger parts 74. When not assuming light reception from the back surface side, a metal film such as a silver (Ag) thin film may be formed instead of the finger parts 75.

The finger parts 74 and 75 and the bus bar parts 76 (the bus bar parts of the light receiving surface electrode 72 are the same) can be formed using conductive paste including a binder resin such as an epoxy resin, a conductive filler such as silver (Ag) or carbon dispersed in the binder resin, and a solvent such as butyl carbitol acetate (BCA). The respective electrodes are formed through an electrode drying process of screen-printing the conductive paste in a desired pattern on the light receiving surface and on the back surface of the photoelectric conversion part 71, then volatilizing the solvent included in the paste, and sintering the conductive filler.

The drying holder 10 is an instrument for holding the solar cell 70 in an upright state, and is preferably used for drying electrodes of the solar cell 70, as described later in detail. The drying holder 10 includes a base part 11 on which the solar cell 70 is placed, and a support part 12 disposed on the base part 11. The base part 11 is a planar member, and supports an end of the solar cell 70 when the solar cell 70 is placed on the drying holder 10. The support part 12 forms the support slot 13 capable of supporting the solar cell 70 in the upright state. Then, the support part 12 is composed of a pair of support units 20a and 20b that are erected on the base part 11.

The drying holder 10 includes the plurality of support parts 12 along the longitudinal direction of the base part 11. That is, the drying holder 10 can accommodate the plurality (5 to 10, for instance) of solar cells 70 in the support slots 13 of the respective support parts 12 simultaneously. While the respective support parts 12 are disposed at a prescribed interval (for instance, an interval of about 1 cm to 5 cm) from each other in the embodiment illustrated in FIG. 1, the support parts 12 may be disposed in contact with each other.

The support unit 20a includes a pair of main walls 21a and 22a that respectively cover the light receiving surface and back surface of the solar cell 70, and a sidewall 23a that covers the side face of the solar cell 70. The main walls 21a and 22a are composed of a thin plate in a roughly rectangular shape for instance, have the same shape, and are disposed opposite to each other along the front-back direction. The main walls 21a and 22a may be disposed in parallel with the left-right direction, but are preferably disposed such that the interval between the two is wider on one end side closer to the support unit 20b. The sidewall 23a connects the other ends of the main walls 21a and 22a with each other, and is disposed roughly parallel to the front-back direction.

The support unit 20b is provided symmetrically to the support unit 20a with respect to the left-right direction, and includes a pair of main walls 21b and 22b and a sidewall 23b that connects the main walls 21b and 22b with each other. The support units 20a and 20b are disposed away from each other so that openings face each other. In such a manner, the support slot 13 is formed. That is, the support part 12 forms the support slot 13 that supports both left and right ends of the solar cell 70 so as to hold it from both sides in the thickness direction such that the solar cell 70 does not fall down.

In the support unit 20a, the main wall 22a is inclined such that an angle θ formed with the base part 11 with respect to the side of the support slot 13 (hereinafter, referred to as the angle θ) becomes an obtuse angle. That is, the support unit 20a has a shape such that the main wall 22a is inclined to the back. In this embodiment, the main wall 21a is also inclined to the back at the angle θ. As a result of this inclination, since the solar cell 70 can be held in the state of being set against the main wall 22a and inclined to the back, the solar cell 70 is prevented from being shaken in the front-back direction and damaged during the electrode drying process, for instance. The main wall 21a may be provided perpendicularly to the base part 11, but is preferably inclined similarly to the main wall 22a, from the viewpoint of preventing interference with another adjacent drying holder 10 (see FIG. 10 described later) or the like, for instance. Also, the main walls 21b and 22b of the support unit 20b are inclined to the back at the same angle as the main walls 21a and 22a.

Here, a preferable dimension or the like of the support part 12 will be described in detail (see FIGS. 4 and 5). A description will be given mainly using the support unit 20a, but the same applies for the support unit 20b. Also, it is assumed that the width W0 of the solar cell 70 is the same vertically and horizontally.

A height h of the main walls 21a and 22a, that is, a length along the up-down direction from an upper surface of the base part 11 to an upper end of the main walls 21a and 22a, is preferably at least 50% or more of the width W0 of the solar cell 70, from the viewpoint of preventing falling of the solar cell 70 or the like. It is more preferably 55% to 80% of the width W0, and is specially preferably 60% to 70% of the width W0. The angle θ is preferably about 95° to 120°, is more preferably about 100° to 115°, and is especially preferably about 105° to 110°, from the viewpoint of suppressing shaking in the front-back direction of the solar cell 70. An interval W1 between the main wall 21a and the main wall 22a is set to such a length that the solar cell 70 does not fall down significantly even in a state where a lower end of the solar cell 70 is in contact with the main wall 21a (the state indicated by two-dot chain lines in FIG. 4), which is such a length that the inclination angle of the solar cell 70 becomes smaller than 45°, for instance. To put it concretely, the interval W1 is preferably about 5 mm to 20 mm.

The interval between the sidewall 23a and the sidewall 23b, that is, a left-right direction length W2 of the support slot 13, is a length for which a clearance CL (a value which is the sum of gaps on both left and right sides) is added to the width W0 of the solar cell 70. The clearance CL is preferably about 3% to 20% of the width W0, is more preferably about 4% to 15%, and is especially preferably about 5% to 10%. A left-right direction length W3 of the main walls 21a and 22a is preferably longer than the clearance CL at least. It is more preferably about 1.5 times to 5 times the clearance CL, and is especially preferably about 3 times to 4 times the clearance CL. When the dimension of the support part 12 is set in such a manner, the solar cell 70 can be stably held in the upright state.

In this embodiment, a plurality of vents 24a and 25a are respectively formed on the main walls 21a and 22a of the support unit 20a. The vents 24a and 25a are through-holes passing through the main walls 21a and 22a respectively in the thickness direction, and allow ventilation of the solvent volatilized from the solar cell 70, for instance. A plurality of vents 24b and 25b are formed respectively on the main walls 21b and 22b of the support unit 20b as well, similarly to the support unit 20a. Hereinafter, the vents 24a and 25a will be described, and the same applies for the vents 24b and 25b.

The vents 24a and 25a are preferably formed over a wide range to the extent that mechanical strength capable of withstanding the use of the support unit 20a can be secured. An area where the vents 24a and 25a are formed hereinafter (referred to as an opening area) is preferably about 20% to 90% of the area of the main walls 21a and 22a, is more preferably about 30% to 80%, and is especially preferably about 40% to 80%. Also, the vents 24a and 25a may be formed unevenly at a part of the main walls 21a and 22a, but are preferably formed uniformly over the entire main walls 21a and 22a.

A large number of the vents 24a and 25a are preferably formed at intervals from each other. That is, the vents 24a and 25a are preferably independent of each other and not communicated. Thus, the opening area can be increased while securing the mechanical strength.

The shape of the vents 24a and 25a is not limited to a perfect circle shape as illustrated, and may be an elliptical shape, a semicircular shape, a triangular shape, a rectangular shape (see FIG. 9 described later), or a combination thereof or the like. Also, the arrangement of the vents 24a and 25a is not limited to a regular arrangement (the arrangement in which three columns of the vents 24a and 25a are formed aligned at equal intervals along the up-down direction) as illustrated, and may be a random irregular arrangement.

In this embodiment, since the main walls 21a and 22a are inclined to the back and the solar cell 70 is held in the state of being in contact with the main wall 22a, air permeability is deteriorated more on the side of the main wall 22a than on the side of the main wall 21a and a drying defect tends to occur. Therefore, the opening area of the main wall 22a may be set larger than the opening area of the main wall 21a. For instance, by increasing the number of the vents 25a or enlarging the size of the vents 25a compared to the vents 24a, the opening area of the main wall 22a can be enlarged.

Configurations of drying holders 30-60 which are the second-fifth embodiments will now be described in detail with reference to FIG. 6 to FIG. 9. Here, differences from the drying holder 10 which is the first embodiment will be described in detail, and the descriptions that overlap with the drying holder 10 will be omitted.

Figure 6:
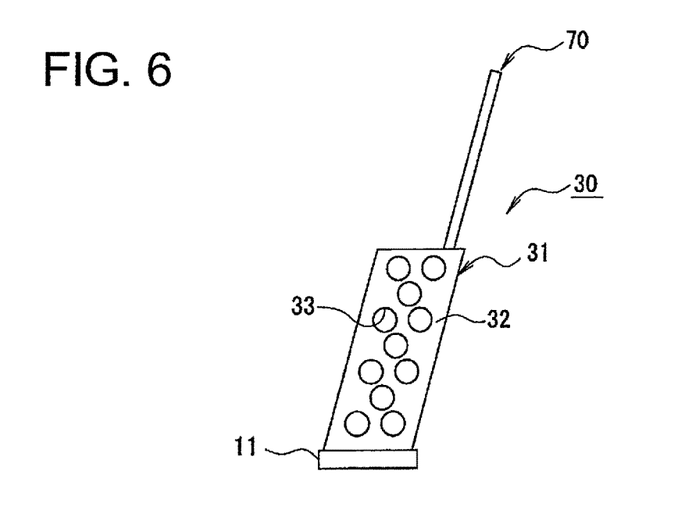
FIG. 6 is a side view illustrating a drying holder which is a second embodiment according to the present invention.

FIG. 6 is a side view illustrating the drying holder 30 which is the second embodiment.

The drying holder 30 includes a pair of support units 31 disposed opposite to each other at an interval corresponding to the support slot 13 in the longitudinal direction of the base part 11. Then, on a sidewall 32 of the support unit 31, a plurality of vents 33 are uniformly formed all over. According to this form, the air permeability in the left-right direction is improved. The support unit 31 may be a form without the vents on the respective main walls, but many vents are preferably formed at least on the main wall with which the solar cell 70 is to be in contact, preferably on the respective main walls.

Figure 7:
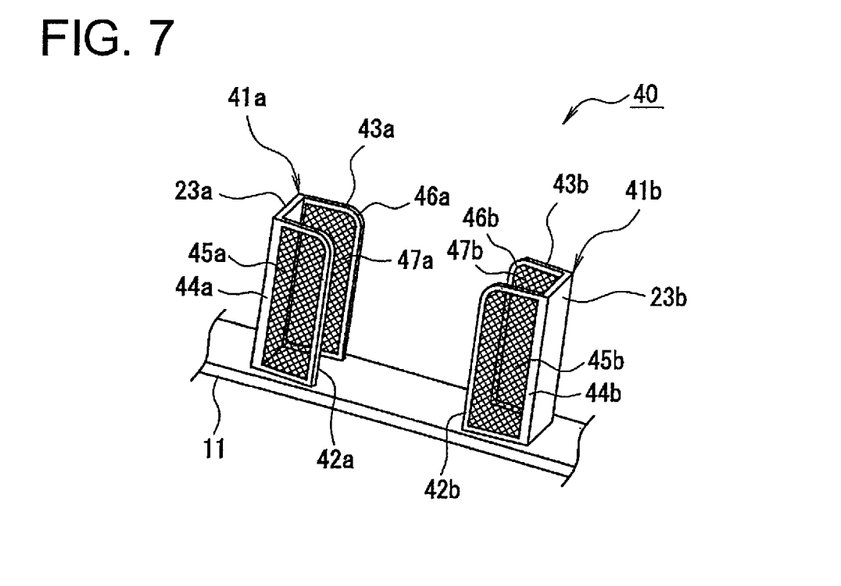
FIG. 7 is a perspective view illustrating a drying holder which is a third embodiment according to the present invention.

FIG. 7 is a perspective view illustrating the drying holder 40 which is the third embodiment.

The drying holder 40 includes a pair of support units 41a and 41b disposed opposite to each other at an interval corresponding to the support slot 13 in the longitudinal direction of the base part 11. The support unit 41a includes a pair of main walls 42a and 43a and a sidewall 23a, similarly to the support unit 20a. However, the main walls 42a and 43a are constituted by frames 44a and 46a and surface lattices 45a and 47a respectively. Also, the main wall 42a and the main wall 43a have the similar structure. The support unit 41b also has the structure similar to the support unit 41a.

The frame 44a constitutes a contour of the main wall 42a, and secures the mechanical strength of the main wall 42a. The surface lattice 45a reinforces the frame 44a. On the main wall 42a, many vents are formed with the surface lattice 45a. According to this form, a large opening area can be easily formed and drying efficiency can be further improved. The main wall 42a may be constituted only by the frame 44a without causing a problem in the mechanical strength of the main wall 42a. Alternatively, a brace-like frame may be provided instead of the surface lattice 45a. In this case, the opening area can be widened further.

Figure 8:
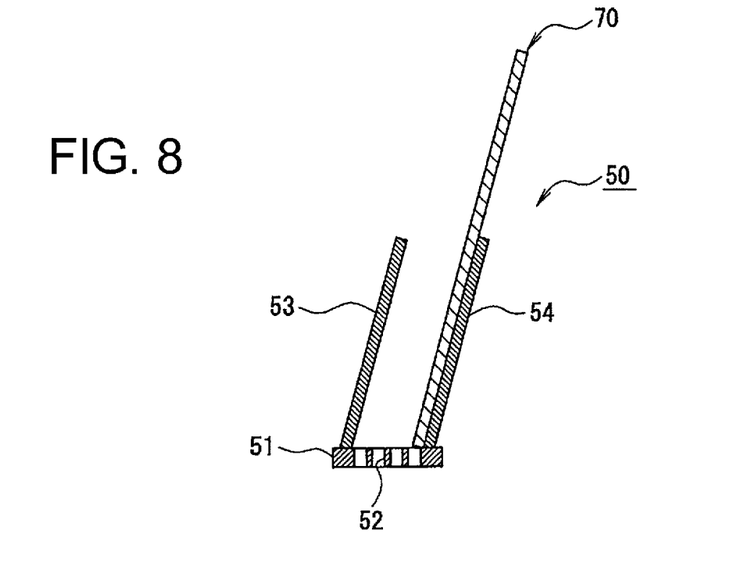
FIG. 8 is a sectional view illustrating a drying holder which is a fourth embodiment according to the present invention.

FIG. 8 is a sectional view illustrating the drying holder 50 which is the fourth embodiment.

In the drying holder 50, a plurality of vents 52 are formed at a base part 51. The vents 52 are preferably formed at least corresponding to parts where main walls 53 and 54 are provided in order to improve the air permeability at the part surrounded by the main walls 53 and 54. According to this form, the air permeability in the up-down direction is improved. Also, the main walls 53 and 54 may be a form without the vents, but many vents are preferably formed at least on the main wall 54 with which the solar cell 70 is to be in contact, as described above.

Figure 9:
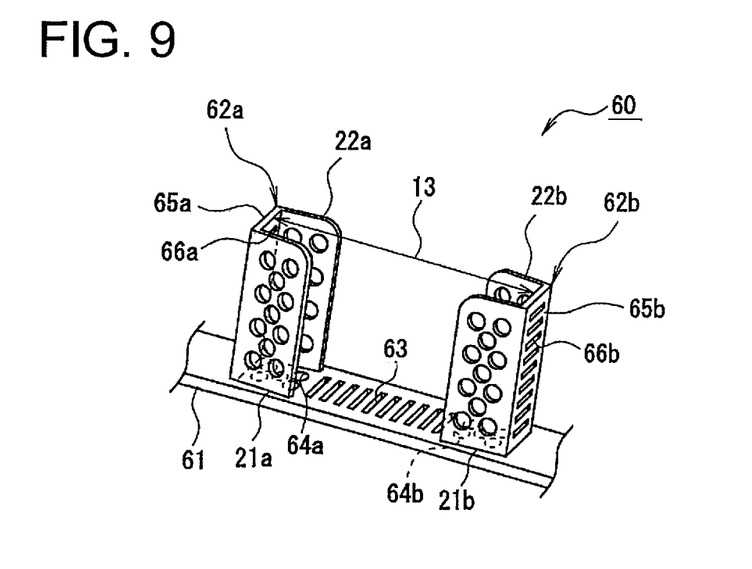
FIG. 9 is a perspective view illustrating a drying holder which is a fifth embodiment according to the present invention.

FIG. 9 is a perspective view illustrating the drying holder 60 which is the fifth embodiment.

In the drying holder 60, vents 63, 64a and 64b are formed on a base part 61, and vents 66a and 66b are formed on sidewalls 65a and 65b, respectively. Otherwise, the configuration is the same as the drying holder 10. That is, the drying holder 60 is a form with the vents formed on all the walls configuring the support slot 13.

At the base part 61, the vents 63, 64a and 64b of different shapes and sizes can be formed. For instance, the vents 64a and 64b in a perfect circle shape are formed respectively at parts surrounded by support units 62a and 62b, and vents 63 in a rectangular shape are formed between the support unit 62a and the support unit 62b. Also, the vents 66a and 66b formed on sidewalls 65a and 65b may be the same rectangular shape as the vents 63, for instance.

Next, with reference to FIG. 10, a drying process of the solar cell 70 using the drying holder 10 will be described in detail. Here, effects of the drying holder 10 will be also described while illustrating the electrode drying process of the light receiving surface electrode 72 and the back surface electrode 73 formed using the conductive paste (meaning the finger parts and the bus bar parts, hereinafter). Also, cases of using the drying holders of the other embodiments will be mentioned.

Figure 10:
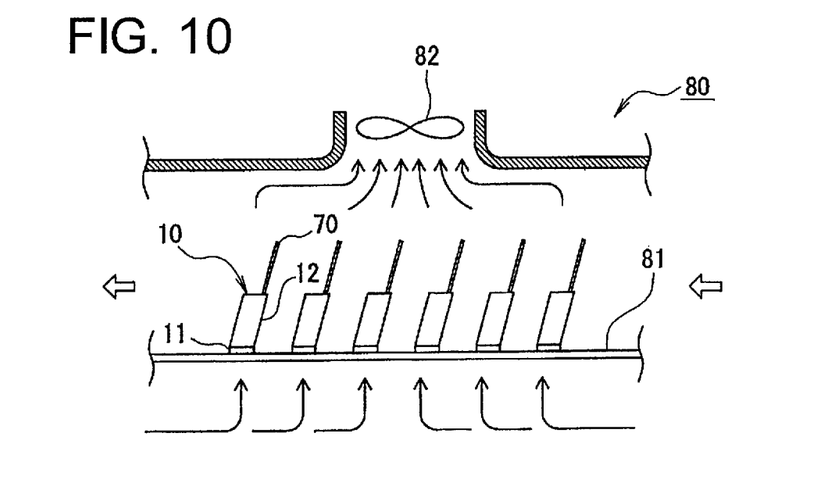
FIG. 10 is a view schematically illustrating an electrode drying process which is an embodiment according to the present invention.

FIG. 10 is a view schematically illustrating the electrode drying process of the solar cell 70. In this view, a direction perpendicular to the paper surface is the longitudinal direction of the base part 11.

The electrode drying process is carried out in the state of accommodating the solar cell 70 having a non-dried light receiving surface electrode 72 and a back surface electrode 73 that are formed using the conductive paste in the support slot 13 of the drying holder 10. A drying facility 80 used in the electrode drying process includes a belt conveyor 81 where the plurality of drying holders 10 can be installed, an exhaust device 82 for exhausting the volatilized solvent, and a heating device, not shown, for instance. In the drying facility 80, an air flow at a high temperature from a lower part to an upper part acts on the solar cell 70 held in the drying holder 10.

The electrode drying process is separated into a temporary drying process for removing the solvent to the extent of eliminating adhesiveness of the conductive paste, and a main drying process for removing the solvent further and sintering a conductive filler. The temporary drying process is the process at a lower temperature and shorter time than the main drying process, and is carried under the condition of 150° C.×15 minutes, for instance. The main drying process is carried out under the condition of 200° C.×40 to 60 minutes, for instance. In an electrode producing process including the electrode drying process, after repeating the screen printing process and temporary drying process of the light receiving surface electrode 72 twice each, the screen printing process and temporary drying process of the back surface electrode 73 are performed preferably. After the temporary drying process of the back surface electrode 73, the main drying process is carried out simultaneously for all the respective electrodes. The screen printing process of the light receiving surface electrode 72 is carried out twice in order to form a narrow and thin electrode. Thus, light receiving loss can be reduced and resistance can be reduced.

In the temporary drying process, the solar cell 70 is preferably held in the state where the electrode to be a drying object is turned to the side of the main walls 21a and 21b. That is, the solar cell 70 is accommodated in the support slot 13 so that the light receiving surface is turned to the side of the main walls 21a and 21b in the temporary drying process of the light receiving surface electrode 72, and the back surface is turned to the side of the main walls 21a and 21b in the temporary drying process of the back surface electrode 73.

The main drying process is preferably carried out continuously with the temporary drying process of the back surface electrode 73 from the viewpoint of productivity improvement or the like. Therefore, the main drying process is carried out in the state where the light receiving surface of the solar cell 70 is in contact with the side of the main wall 22a and the main wall 22b. The air permeability tends to be deteriorated in an area of the solar cell 70 covered with the respective main walls, particular at a part of the light receiving surface that is in contact with the main walls 22a and 22b, compared to the other area, but because of the drying holder 10, the drying defect in this area can be suppressed. Since many vents are formed on the respective main walls of the drying holder 10, a discharge route of the solvent can be secured, and the solvent is hardly confined between the respective main walls and the solar cell 70.

In the electrode drying process, the air flow at the high temperature passes through many vents and easily acts on the solar cell 70. That is, in the electrode drying process, the air flow can be introduced from the vents formed on the respective main walls into the support slot 13. In particular, introducing the air flow from the vents 25a and 25b formed on the main walls 22a and 22b into the support slot 13 is effective from the viewpoint of suppressing the drying defect.

In the electrode drying process, in the main drying process in particular, as illustrated by the two-dot chain lines in FIG. 4, the solar cell 70 may be accommodated in the support slot 13 in the state of being inclined more than the main walls 22a and 22b. For instance, the lower end of the solar cell 70 is accommodated in the state of being brought into contact with the main walls 21a and 21b. In this case, since a gap between the light receiving surface of the solar cell 70 and the main walls 22a and 22b becomes large, the air permeability on the light receiving surface side becomes better.

Also, in the drying facility 80 where the air flow at the high temperature from the lower part to the upper part is generated, it is effective to form the vents at the base part as in the drying holders 50 and 60. In this case, the air flow is easily introduced from the vents at the base part into the support slot, and the drying efficiency is improved. Since the confinement of the solvent inside the support slot is suppressed, it is also effective to form the vents on the sidewalls as in the drying holders 30 and 60. In this case, the air flow can be introduced into the support slot from the vents formed on the sidewalls as well. Also, when it is desired to improve the drying efficiency further in the case where a solvent amount to be removed is large or in the case where the drying time is short or the like, it is effective to enlarge the opening area of the main walls or the like as in the drying holders 40 and 60.

As described above, the drying holder 10 is structured such that it has the support part 12 of an outside dimension capable of stably supporting the solar cell 70, and many vents are provided the support part 12. Therefore, the area covered with the support part 12 can be reduced without spoiling the performance of supporting the solar cell 70. The drying holder 10, by having many vents, for instance, secures the discharge route of the solvent, improves the distributability of the air flow inside the support slot 13, and suppresses the drying defect in the electrode drying process.

By using the drying holder 10, the rise in the series resistance due to the drying defect is suppressed, and a highly reliable solar cell can be provided.

The design of the embodiments described above can be appropriately changed in such a range as not to depart from the object of the invention.

For instance, the form may be a combination of the first to fifth embodiments. A concrete example is the form of applying the main walls 43a and 43b of the drying holder 40 instead of the main walls 22a and 22b of the drying holders 10 and 60 or the like.

Also, the support unit may be the form constituted only by the main walls without having the sidewalls.

REFERENCE SIGNS LIST

10 drying holder of solar cell (drying holder), 11 base part, 12 support part, 13 support slot, 20a, 20b support unit, 21a, 21b, 22a, 22b main wall, 23a, 23b sidewall, 24a, 24b, 25a, 25b vent, 70 solar cell, 71 photoelectric conversion part, 72 light receiving surface electrode, 73 back surface electrode, 74, 75 finger part, bus bar part, 80 drying facility, 81 belt conveyor, 82 exhaust device.

The invention claimed is:

1. A method of producing a solar cell, the method comprising:

providing a drying apparatus comprising a plurality of drying holders and a conveyor connecting the plurality of drying holders, wherein a support part of the drying holder comprises a pair of support units that are disposed away, each of the pair of support units has a sidewall that extends along a short-side direction of the rectangular base part, and two main walls that extend from edges of the sidewall along a direction crossing the sidewall, and an opening is formed by the sidewall and the two main walls, the support part is placed in such a manner that the openings oppose each other, and vents are formed on the two main walls facing a surface of the solar cell, in the drying the solar cell, an air flow is introduced into the support slot from vents formed on the pair of main walls, and each of the surfaces of the solar cell facing the main walls is a surface on which an electrode is formed, drying a solar cell with the drying apparatus, the drying the solar cell comprising:

placing the solar cell on a rectangular base part of a drying holder of the plurality of drying holders; and setting the solar cell in an upright state using the support part.

2. The method for producing a solar cell according to claim 1, wherein one of the pair of main walls is inclined such that an angle formed with the base part to the support slot side becomes an obtuse angle, and the air flow is introduced into the support slot from the vents formed on the pair of main walls.

3. The method for producing a solar cell according to claim 1, wherein the solar cell is dried in a state where the solar cell contacts one of the main walls.

4. The method of producing a solar cell according to claim 1, wherein the main wall has a surface facing a direction of movement of the conveyor.

5. The method of producing a solar cell according to claim 1, wherein the main walls comprise a front-side main wall and a backside main wall; and an opening area formed on the backside main wall is larger than an opening area formed on the front-side main wall.

\* \* \* \* \*